United States Patent
Moore

(10) Patent No.: US 9,990,449 B2
(45) Date of Patent: Jun. 5, 2018

(54) PIPELINE DESIGN AND INSTALLATION SYSTEMS AND METHODS

(71) Applicant: Cleveland Brothers Equipment Co., Inc., Murrysville, PA (US)

(72) Inventor: Abel Moore, Clinton, PA (US)

(73) Assignee: Cleveland Brothers Equipment Co., Inc., Murrysville, PA (US)

( * ) Notice: Subject to any disclaimer, the term of this patent is extended or adjusted under 35 U.S.C. 154(b) by 386 days.

(21) Appl. No.: 14/661,838

(22) Filed: Mar. 18, 2015

(65) Prior Publication Data
US 2015/0269288 A1    Sep. 24, 2015

Related U.S. Application Data

(60) Provisional application No. 61/954,637, filed on Mar. 18, 2014.

(51) Int. Cl.
*G06F 17/50*    (2006.01)

(52) U.S. Cl.
CPC ...... *G06F 17/5004* (2013.01); *G06F 17/5086* (2013.01)

(58) Field of Classification Search
CPC .......................... G06F 17/5004; G06F 17/5086
USPC .......................................................... 703/1
See application file for complete search history.

(56) References Cited

U.S. PATENT DOCUMENTS

| | | | |
|---|---|---|---|
| 6,965,848 B2 * | 11/2005 | Ballus | G06F 17/5004 454/231 |
| 7,007,534 B1 * | 3/2006 | Myklebust | B21D 7/024 29/819 |
| 2014/0200863 A1 * | 7/2014 | Kamat | G01C 15/00 703/1 |

OTHER PUBLICATIONS

Jeong et al., "Imaging and Locating Buried Utilities", 2003, Publication FHWA/IN/JTRP—Dec. 2003, Joint Transportation Research Program, Indiana Department of Transportation and Purdue University, West Lafayette, Indiana, pp. i-238.*

Talmaki et al., "Comprehensive Collision Avoidance System for Buried Utilities", 2010, Proceedings of the International Conference on Sustainable Urbanization (ICSU), Hong Kong Polytechnic University, pp. 1-10.*

Sandurkar and Chen, "GAPRUS-genetic algorithms based pipe routing using tessellated objects", 1999, Computers in Industry 38.3, pp. 1-37.*

(Continued)

*Primary Examiner* — Juan Ochoa

(74) *Attorney, Agent, or Firm* — Michael D. Lazzara, Esq.; Leech Tishman Fuscaldo & Lampl

(57) ABSTRACT

A method and system for installing pipelines are disclosed. The method and system comprise creating a three-dimensional model of a work area, generating a proposed pipe alignment for fitting the pipeline within the work area, creating a three-dimensional model of a trench to be excavated within the work area based on the proposed pipe alignment, excavating the trench with a work tool to conform with the three-dimensional model of the trench, determining the position of the work tool during the excavating step, comparing the determined position of the work tool during the excavating step with the three-dimensional model of the trench to determine any differences between the excavated trench and the three-dimensional model of the trench, and adjusting the proposed pipe alignment to generate an adjusted pipe alignment based on the differences between the excavated trench and the three-dimensional model of the trench.

18 Claims, 1 Drawing Sheet

(56) References Cited

OTHER PUBLICATIONS

Talmaki et al., "Geometric modeling of geospatial data for visualization-assisted excavation", 2013, Advanced Engineering Informatics 27.2, pp. 283-298.*
Roadway Design Manual, 2014, Texas Department of Transportation, pp. 2-32, 2-33.*

* cited by examiner

PIPELINE DESIGN AND INSTALLATION SYSTEMS AND METHODS

CROSS-REFERENCE TO RELATED APPLICATION

This application claims the benefit of U.S. Provisional Patent Application Ser. No. 61/954,637 filed Mar. 18, 2014, which is incorporated herein by reference.

FIELD OF THE INVENTION

The present invention relates to pipeline design and installation systems and methods.

BACKGROUND INFORMATION

Pipelines that are used for transmission and distribution of various substances, such as water, sewage, natural gas, petroleum products, etc., are buried several feet below the ground in many applications. The pipe that constitutes a pipeline may be constructed of, for example, metal, plastic, concrete, ceramic, fiberglass, etc. Construction of a pipeline may follow a general procedure that may include: establishment of a right of way; clearing and grading of the land; stringing or delivering pipe to the construction site; bending and/or joining (e.g., welding, gluing, etc.) of pipe; excavation of a trench; installation of pipe into the trench; and backfilling the trench and dressing the land.

SUMMARY OF THE INVENTION

An aspect of the present invention is to provide a method of installing a pipeline comprising: creating a three-dimensional model of a work area; generating a proposed pipe alignment for fitting the pipeline within the work area; creating a three-dimensional model of a trench to be excavated within the work area based on the proposed pipe alignment; excavating the trench with a work tool to conform with the three-dimensional model of the trench; determining the position of the work tool during the excavating step; comparing the determined position of the work tool during the excavating step with the three-dimensional model of the trench to determine any differences between the excavated trench and the three-dimensional model of the trench; and adjusting the proposed pipe alignment to generate an adjusted pipe alignment based on the differences between the excavated trench and the three-dimensional model of the trench.

Another aspect of the present invention is to provide a non-transitory computer-readable medium comprising instructions which when executed by a processor cause the processor to perform a method for analyzing a pipeline installation. The medium comprises: instructions for creating a three-dimensional model of a work area; instructions for generating a proposed pipe alignment for fitting the pipeline within the work area; instructions for creating a three-dimensional model of a trench to be excavated within the work area based on the proposed pipe alignment; instructions for causing a work tool to excavate the trench to conform with the three-dimensional model of the trench; instructions for determining the position of the work tool during the excavating step; instructions for comparing the determined position of the work tool during the excavating step with the three-dimensional model of the trench to determine any differences between the excavated trench and the three-dimensional model of the trench; and instructions for adjusting the proposed pipe alignment to generate an adjusted pipe alignment based on the differences between the excavated trench and the three-dimensional model of the trench.

These and other aspects of the present invention will be more apparent from the following description.

DETAILED DESCRIPTION

Embodiments of the invention are directed generally to the design and installation of pipelines, and more particularly, but not by way of limitation, to devices, methods and systems for more efficient design and installation of pipelines. Embodiments allow for creation of an optimal or near optimal alignment (e.g., a best fit) of the installed pipe, minimize the amount of excavation needed to install the pipe in the ground, and allow fitment of the pipe into the ground by utilizing a trench design.

While the description herein generally refers to pipeline design and installation, it should be understood that the devices, systems and methods apply to other types of construction and industrial design and installation. The described embodiments of the invention should not be considered as limiting.

The installation contractor may be provided plan drawings with right of way information along with a general location where the pipeline should be installed. A set of standard drawings may also be provided to show typical installation guidelines. Thus, there is a certain amount of flexibility as to the final location of the installed pipeline.

In a pipe installation, it is desirable that the pipe fit into the excavated trench without any stressing or bending that could cause cracks, leaks or ultimately failure. Material is often over excavated, creating an area much larger than needed to ensure that the pipe fits into the trench. Over excavation is timely and adds additional cost to an installation project.

Bendable pipe is often bent in the field at the construction site by bending engineers so that the pipe matches the general alignment and lay of the land. This is accomplished by the use of portable bending machines, which may be staged at temporary sites along the pipeline. Calculations are made by use of hand-held calculators and reference books.

Embodiments of the invention may be used with or incorporated in a computer system (or in a plurality of computer systems) that may be a standalone unit or include one or more remote terminals or devices in communication with a central computer via a network such as, for example, the Internet or an intranet. As such, the computer or processor and related components described herein may be a portion of a local computer system or a remote computer or an on-line system or combinations thereof. The software described herein may be stored in computer internal memory or in a non-transitory computer readable medium.

Figure 1:
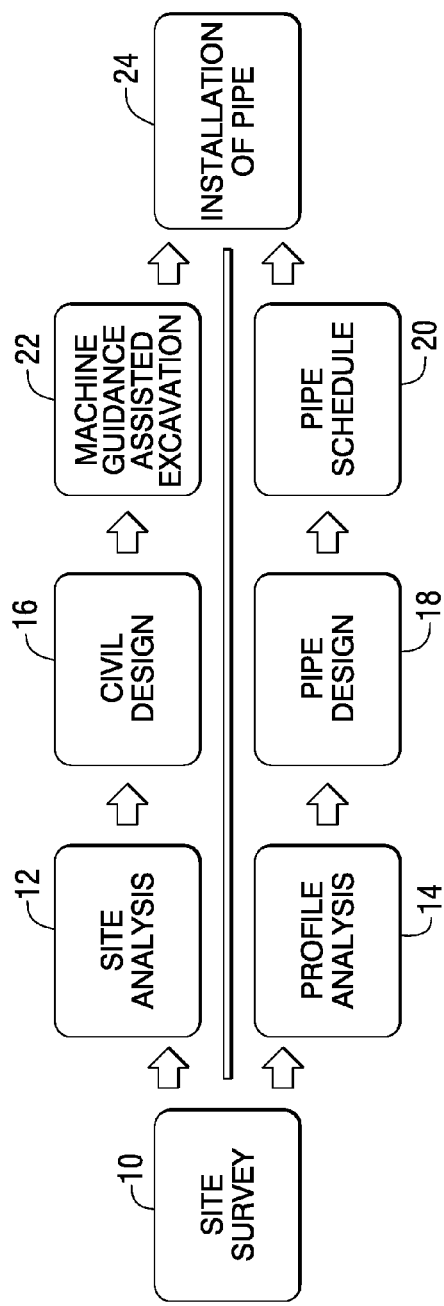
FIG. 1 illustrates an embodiment of a process for designing and installing a pipeline.

FIG. 1 illustrates an embodiment of a process for designing and installing a pipeline. A typical work area or excavation site for a pipeline may include a right of way, e.g., from 50 to 200 feet wide. At step 10, once the right of way for the pipeline has been cleared of vegetation and obstacles, a topographic survey may be conducted to record the elevations of the work area. The survey may be of a tolerance acceptable for earthmoving operations, e.g., approximately 0.1 of a foot, and may be accomplished using a GPS instrument. Such a real time kinematic survey may be done by, for example, mounting a GPS receiver on an off-road vehicle and driving along the construction site to record the data.

At step 12, data recorded in the field at step 10 may be processed with the use of, for example, a civil module to create a model of the existing surface of the ground. By way of example, such a module may include the Trimble® Business Center software or the Carlson Civil Suite® software. Areas requiring additional attention such as, for example, streams, roadway crossings, structures or tie-in points to existing lines may be notated so that the designed pipeline alignment meets the requirements and standards of the project.

After a model has been created of the existing conditions at step 12, a pipe alignment may be generated at step 14 to fit the pipe into the right of way using, for example, the straightest path along the right of way in order to minimize the overall length of the pipeline. In various embodiments, the pipe alignment may minimize the amount of bends needed to construct the pipeline, thus making the excavation process more efficient. The bend radius or amount of curvature of the pipe may also be minimized in order to avoid abrupt directional changes that could possibly cause increased stress on the pipe or inefficient flow of material through the pipe. The term "minimized" as used herein when referring to the overall length of the pipeline or the number of bends in the pipeline means that the length of the pipeline or the number of bends are reduced in comparison with other possible lengths or numbers of bends that could possibly be used. In addition, the length of each individual pipe section may be maximized in order to reduce the number of joining operations, such as welding, that must be performed during assembly of the pipeline. The term "maximized" as used herein when referring to the lengths of individual pipe sections means that the lengths of at least some of the sections are increased in comparison with other possible pipe section lengths that could possibly be used. In various embodiments, an alignment module may be used to prepare the pipe alignment. In various embodiments, the alignment module may be the AutoCAD P&ID piping design software.

At step 16, a three dimensional model of the trench to be excavated may be created from the alignment of the pipe generated at step 14 using, for example, a civil modeling module. By way of example, such a module may include the Trimble Business Center software or the Carlson Civil Suite® software. In various embodiments, a design incorporating the bottom of the trench and the side slopes may be used to calculate excavation quantities and locate any areas of excavation that may require special attention during the excavation process.

At step 18, the proposed pipe alignment generated at step 14 may be input into a mechanical design module with bending parameters to create a pipe schedule 20 that includes detail for each individual pipe section to be installed. In various embodiments, details such as location and degree of bends needed may be specified so that a pipe bending crew at the construction site may work further ahead while ensuring the pipe will fit into the trench.

At step 22, the three dimensional civil model created at step 16 is loaded into, for example, surveying instruments and machine guidance systems to provide field crews at the construction site with real time design information. Excavators and other earth moving equipment with machine guidance may dig the trench according to the design with little or no ground support. In various embodiments, the Trimble® GCS900 Grade Control System may be used to provide machine guidance.

At step 24, the pipes may be delivered and staged (i.e., the stringing of the pipe) in the field. In various embodiments, the pipes are numbered to keep them in a specific order. After the pipe sections have been welded or otherwise connected together, inspected and treated with a coating to prevent corrosion in the case of metal pipes, the pipeline assembly may be laid into the trench. Because both the excavation and pipe bending processes use the same design, the pipe will fit into its final location with little or no strain or interference.

Figure 2:
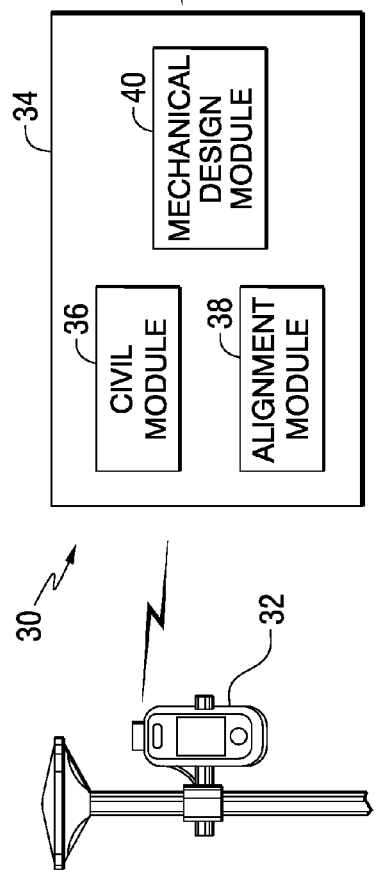
FIG. 2 illustrates an embodiment of a system which may be used to design and install a pipeline.

FIG. 2 illustrates an embodiment of a system 30 which may be used to design and install a pipeline. Surveying equipment 32 may be used to perform a topographic survey. Such equipment may be, for example, optical or GPS enabled equipment. The surveying equipment 32 may be mounted on an off-road vehicle that traverses the construction site to record the topological data. The surveying equipment 32 is in communication with a processor 34. The processor 34 may include a civil module that is used to create a model of the surface of the ground in which a pipeline is to be laid and to create a model (e.g., a three-dimensional model) of the trench that is to be excavated. By way of example, such a module may include the Trimble Business Center software. The processor may also include an alignment module 38 that creates a pipe alignment that fits the pipe into the trench in, for example, a best fit manner that minimizes the amount of pipe bends necessary for the pipeline. A mechanical design module 40 may be used to create a pipe schedule that includes the details of each individual pipe section that is to be installed in the pipeline.

The processor 34 is in communication with an excavator 42 having a work tool 44 such as an excavating, scraping, trenching, grading or compacting tool, or the like. The excavator 42 may comprise any known type of excavation equipment, including backhoes, bulldozers, scrapers, trenchers, graders, compactors, and the like.

The excavator 42 may be equipped with at least one work tool guidance device 46. In the embodiment shown in FIG. 2, a single guidance device 46 is mounted on the excavator 42. However, more than one on-board guidance device 46 may be provided on the excavator 42. In addition, off-board guidance devices may be provided in addition to, or in place of, the on-board guidance device(s). For example, at least one guidance device may be located on or near the excavation site.

In certain embodiments, the guidance device 46 mounted on the excavator 42 may provide three-dimensional (3D) capabilities, e.g., such that each tip of the work tool is precisely located. For example, the position of the work tool and the resultant trench shape and position may be detected within a tolerance range of from 0.5 to 6 inches, for example, from 1 to 3 inches. The guidance device 46 may be composed of sensors such as GPS receivers, slope sensors, inertial sensors or stroke sensing hydraulic cylinders working as a system to provide real-time location of the work tool 44. In addition to on-board guidance devices 46, off-board guidance devices (not shown) may be used on or near the excavation site.

The guidance device(s) 46 allow for precise determinations of the work tool position and provide for a comparison to the design elevation, and for determining the need to cut or fill in order to achieve the design elevation. In certain embodiments, such cut/fill data may be used to drive the valves for automatic work tool control, or may be shown on an in-cab display that provides visual guidance for manual operations. In addition to digging and cutting operations, the position of work tools during compaction operations may also be determined by the guidance device 46.

In accordance with embodiments of the invention, the various positions of the work tool during an excavation operation may be stored and compared with the previously generated three-dimensional model of the trench in order to determine any differences between the excavated trench and the three-dimensional model of the trench. When differences are detected, the initially proposed pipe alignment may be adjusted to generate an adjusted pipe alignment that takes into account the differences between the excavated trench and the three-dimensional model of the trench. In certain embodiments, the determined differences between the excavated trench and the three-dimensional model of the trench at various points along the excavated trench corresponding to points along the three-dimensional model of the trench may be within a tolerance range of from 0.5 to 6 inches, for example, from 1 to 3 inches.

In certain embodiments, the initially proposed pipe alignment and/or the adjusted pipe alignment may be represented in terms of geographic coordinates in the form of particular latitude and longitude values or a similar x-y coordinate system, and in terms of elevation values. In this manner, individual points along the pipeline may be represented in three-dimensional space by their respective geographic coordinates and elevations for both the proposed pipe alignment and the adjusted pipe alignment.

In another aspect, the invention may be implemented as a non-transitory computer readable medium containing software for causing a computer or computer system to perform the methods described above. The software can include various modules that are used to enable a processor and a user interface to perform the methods described herein.

Whereas particular embodiments of this invention have been described above for purposes of illustration, it will be evident to those skilled in the art that numerous variations of the details of the present invention may be made without departing from the invention as defined in the appended claims.

What is claimed is:

1. A method of installing a pipeline comprising:
    creating a three-dimensional model of a work area;
    generating a proposed pipe alignment for fitting the pipeline within the work area wherein:
        the proposed pipe alignment includes the pipeline having at least two pipe sections, and
        the proposed pipe alignment maximizes lengths of individual pipe sections of the pipeline;
    creating a three-dimensional model of a trench to be excavated within the work area based on the proposed pipe alignment;
    excavating the trench with a work tool to conform with the three-dimensional model of the trench;
    determining the position of the work tool during the excavating step;
    comparing the determined position of the work tool during the excavating step with the three-dimensional model of the trench to determine any differences between the excavated trench and the three-dimensional model of the trench; and
    adjusting the proposed pipe alignment to generate an adjusted pipe alignment based on the differences between the excavated trench and the three-dimensional model of the trench.

2. The method of claim 1, wherein the three-dimensional model of the work area is created by topographically mapping the work area including recording elevations within the work area.

3. The method of claim 1, wherein the work area comprises a right of way.

4. The method of claim 3, wherein the right of way has a width of from 50 to 200 feet.

5. The method of claim 1, wherein the proposed pipe alignment minimizes the overall length of the pipeline.

6. The method of claim 1, wherein the proposed pipe alignment minimizes the number of curves in the pipeline.

7. The method of claim 1, wherein the position of the work tool during the excavating step is determined by a guidance device.

8. The method of claim 7, wherein the guidance device is mounted on an excavator to which the work tool is attached.

9. The method of claim 7, wherein the guidance device determines geographic coordinates and elevation of the work tool within a tolerance of 3 inches or less.

10. The method of claim 1, wherein the determined differences between the excavated trench and the three-dimensional model of the trench are within a tolerance range of from 1 to 3 inches.

11. The method of claim 1, wherein the adjusted pipe alignment comprises adjustments to geographic coordinates of at least a portion of the pipeline.

12. The method of claim 1, wherein the adjusted pipe alignment comprises adjustments to elevations of at least a portion of the pipeline.

13. The method of claim 1, wherein the adjusted pipe alignment comprises adjustments to geographic coordinates and elevations of at least a portion of the pipeline.

14. The method of claim 1, further comprising staging individual pipe sections of the pipeline in or adjacent to the excavated trench.

15. The method of claim 14, further comprising bending at least some of the pipe sections to conform with the adjusted pipe alignment.

16. The method of claim 14, further comprising connecting the individual pipe sections together.

17. The method of claim 16, wherein the individual pipe sections are connected together by welding.

18. A non-transitory computer-readable medium comprising instructions which when executed by a processor cause the processor to perform a method for analyzing a pipeline installation, the medium comprising:
    instructions for creating a three-dimensional model of a work area;
    instructions for generating a proposed pipe alignment for fitting the pipeline within the work area wherein:
        the proposed pipe alignment includes the pipeline having at least two pipe sections, and
        the proposed pipe alignment maximizes lengths of individual pipe sections of the pipeline;
    instructions for creating a three-dimensional model of a trench to be excavated within the work area based on the proposed pipe alignment;
    instructions for causing a work tool to excavate the trench to conform with the three-dimensional model of the trench;
    instructions for determining the position of the work tool during the causing a work tool to excavate step;
    instructions for comparing the determined position of the work tool during the causing a work tool to excavate step with the three-dimensional model of the trench to determine any differences between the excavated trench and the three-dimensional model of the trench; and instructions for adjusting the proposed pipe alignment to generate an adjusted pipe alignment based on the differences between the excavated trench and the three-dimensional model of the trench.

\* \* \* \* \*